United States Patent
Huang et al.

(10) Patent No.: US 9,768,218 B2
(45) Date of Patent: Sep. 19, 2017

(54) SELF-ALIGNED BACK SIDE DEEP TRENCH ISOLATION STRUCTURE

(71) Applicant: Taiwan Semiconductor Manufacturing Co., Ltd., Hsin-Chu (TW)

(72) Inventors: Yimin Huang, Hsinchu (TW); Jhy-Jyi Sze, Hsin-Chu (TW); Alexander Kalnitsky, San Francisco, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/836,019

(22) Filed: Aug. 26, 2015

(65) Prior Publication Data

US 2017/0062495 A1    Mar. 2, 2017

(51) Int. Cl.
*H01L 27/14* (2006.01)
*H01L 27/146* (2006.01)

(52) U.S. Cl.
CPC .... *H01L 27/1463* (2013.01); *H01L 27/14614* (2013.01); *H01L 27/14636* (2013.01); *H01L 27/14643* (2013.01); *H01L 27/14689* (2013.01)

(58) Field of Classification Search
CPC ............... H01L 27/14; H01L 27/1463; H01L 27/14614; H01L 27/14636; H01L 27/14643; H01L 27/14689; H01L 27/146
See application file for complete search history.

(56) References Cited

U.S. PATENT DOCUMENTS

| | | | |
|---|---|---|---|
| 9,431,452 B1* | 8/2016 | Liu | H01L 27/14645 |
| 9,443,899 B1* | 9/2016 | Liu | H01L 27/14643 |
| 2006/0276014 A1* | 12/2006 | Hsu | H01L 27/14601 |
| | | | 438/526 |
| 2008/0157283 A1* | 7/2008 | Moslehi | H01L 31/042 |
| | | | 257/618 |
| 2009/0200625 A1* | 8/2009 | Venezia | H01L 27/1463 |
| | | | 257/432 |
| 2012/0025199 A1* | 2/2012 | Chen | H01L 27/1464 |
| | | | 257/75 |
| 2012/0132974 A1* | 5/2012 | Voldman | H01L 21/28525 |
| | | | 257/301 |
| 2014/0131779 A1* | 5/2014 | Takeda | H01L 27/14689 |
| | | | 257/292 |
| 2015/0243694 A1* | 8/2015 | Ihara | H01L 27/14605 |
| | | | 257/443 |
| 2016/0043120 A1* | 2/2016 | Ahn | H01L 27/1463 |
| | | | 257/229 |
| 2016/0211290 A1* | 7/2016 | Tsai | H01L 27/1464 |

* cited by examiner

*Primary Examiner* — Fazli Erdem
(74) *Attorney, Agent, or Firm* — Eschweiler & Potashnik, LLC

(57) ABSTRACT

A pixel sensor device is disclosed. The device includes a shallow trench isolation structure, a well region and a backside isolation structure. The well region and diode region is adjacent to the shallow trench isolation structure. The backside isolation structure is self-aligned with and arranged over the shallow trench isolation structure. The backside isolation structure is adjacent to the diode region. An immersion lithographic arrangement is disclosed that compensates for immersion tool drift.

20 Claims, 7 Drawing Sheets

SELF-ALIGNED BACK SIDE DEEP TRENCH ISOLATION STRUCTURE

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

Electronic circuits can interfere with adjacent circuits by leaking current or charge into the adjacent devices. One technique to mitigate this leakage is by forming isolation structures between the adjacent devices. The isolation structures are typically formed prior to forming the integrated circuits, such as transistors.

One type of isolation structure is a shallow trench isolation (STI) structure. Typically, the STI structure is formed by forming a shallow trench in a silicon substrate. The trench is filled with silicon dioxide. Then, a chemical mechanical planarization process is used to remove excess silicon dioxide. Then, integrated circuits, such as transistors, are formed and leakage between adjacent circuits is mitigated by the STI structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
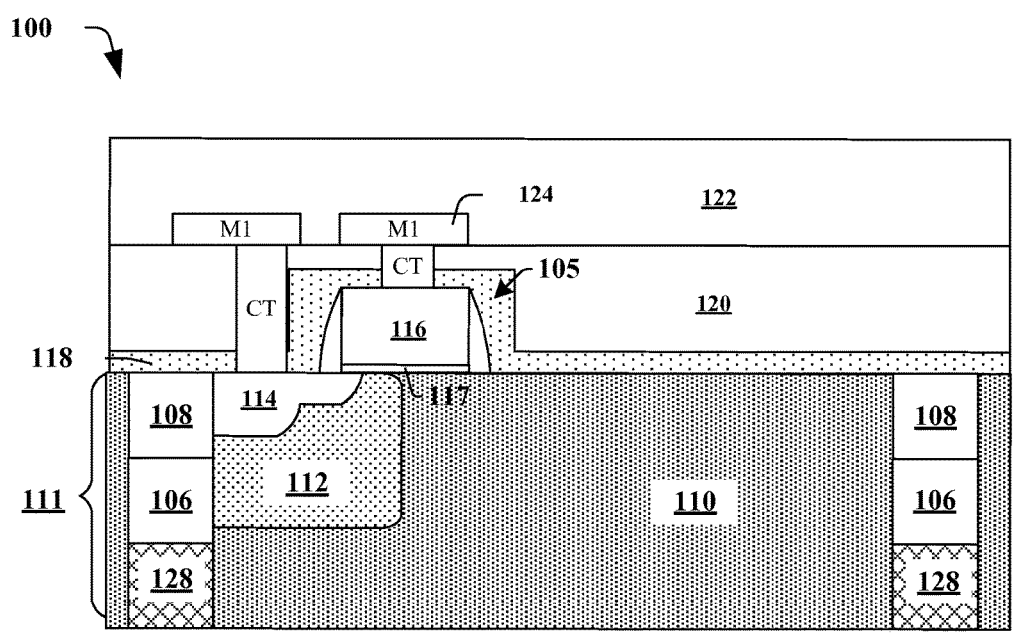
FIG. 1 is a cross sectional view of some embodiments of a pixel sensor semiconductor device having self-aligned back side deep trench isolation structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Semiconductor devices are fabricated to have many electronic circuits, including transistors, in a relatively small area. Leakage or interference between the electronic circuits is mitigated by using isolation regions or structures. The isolation structures include a dielectric material, such as silicon dioxide, and mitigate the leakage between adjacent electronic circuits.

One type of isolation structure is a shallow trench isolation (STI) structure. Typically, the STI structure is formed by forming a shallow trench in a silicon substrate. The trench is filled with silicon dioxide. Then, a chemical mechanical planarization process is used to remove excess silicon dioxide. Then, integrated circuits, such as transistors, are formed and leakage between adjacent circuits is mitigated by the STI structure.

Another type of isolation structure is a deep trench isolation (DTI) structure. Generally, a deep trench is formed in a substrate. The deep trench is filled with one or more dielectric materials. Then, a process removes excess fill material.

Semiconductor substrates have a front side on which semiconductor devices are formed and a back side opposite the front side. STI and DTI structures are commonly disposed on the front side to facilitate isolation between adjacent electronic circuits on the front side. The front side isolation structures can be formed prior to electronic devices being formed thereon. Back side isolation structures are also used to provide isolation and mitigate interferences from the adjacent electronic circuits. Thus, back side isolation structures are employed to mitigate the interference from adjacent devices including, but not limited to, providing shielding, mitigating parasitic capacitance and mitigating leakage current between adjacent devices. The back side isolation structures include backside shallow trench isolation structures (BSTI) and back side deep trench isolation (BDTI) structures.

Unfortunately, forming the back side isolation structures can be problematic. The back side isolation structures are typically formed after electronic devices are formed. As a result, the formation of the deep or shallow trenches is more difficult as fabrication processes can degrade or impact the already formed circuits. Additionally, filling the trenches with the isolating material can also be problematic.

In view of the above, the present application is directed toward a self-aligned back side deep trench isolation (BDTI) structure. The BDTI structure is formed after removing a substrate while mitigating degradation to existing electronic circuits. Deep trenches are formed using a suitable selective removal process without lithography or other similar process that could damage the existing electronic circuits. The deep trenches are self-aligned to front side deep trench isolation structures in order to facilitate front and back side isolation. The deep trenches are selectively filled and planarized without damage to the existing electronic circuits. As a result, the BDTI structures are formed on back sides that provide suitable isolation to back side circuits. Additionally, the BDTI structures can provide electrical connection to buried layers and the like.

FIG. 1 is a cross sectional view of a pixel sensor semiconductor device 100 having self-aligned back side deep trench isolation structures. The view is provided as an example and for illustrative purposes. It is appreciated that variations in the various layers are contemplated.

The pixel sensor device 100 can be used for light or radiation measurement or detection. The pixel sensor device 100 is typically part of a pixel array or pixel group that measures light or radiation intensity for an integration time. Image data from the pixel group is gathered to reconstruct a digital version of an image.

In one example, the device 100 includes a transistor 105 disposed on a semiconductor substrate 111, such as a bulk silicon substrate or silicon on insulator (SOI) substrate. The transistor 105 allows for selective readout of charge. The transistor 105 is disposed over a doped region 110, also referred to as a photo diode region, which has a first doping type (e.g., n-type) in semiconductor substrate 111. A conductive gate electrode 116, which is isolated from substrate 111 by a gate dielectric 117, is arranged between a source/drain region 114 and well region 112. The source/drain region 114, also referred to as a floating node (FD), has the first doping type (e.g., n-type). The well region 112 is under the source/drain region 114 and has a second doping type (e.g., p-type). The performance of the pixel sensor is enhanced by isolation including, shielding, mitigated parasitic capacitance, mitigated leakage current between adjacent sensors, and the like. Although the well region 112 is illustrated as a single continuous region having the second doping type, it will be appreciated that different regions in the region 112 can have different concentrations. For example, the well region 112 can include lightly doped regions under gate electrode sidewall spacers, and can also include another well region extending downwardly into the substrate. Additionally, the well region 112 is typically shallower than the doped region 110. In one example, the well region 112 is several hundred nanometers below the source/drain region 114.

The device 100 includes a back side deep trench isolation (BDTI) structure 128 formed over a shallow trench structure (STI) 108. The BDTI structure 128 provides shielding for the pixel sensor. A poly layer or other suitable layer 106 is formed between the BDTI structure 128 and the STI structure 108.

The composition of the layer 106, structure 108 and structure 128 impact performance of the pixel sensor. A contact etch stop layer 118 is formed under the well region 112, gate 116, source/drain region 114 and the isolation structure 108. In one example, the contact etch stop layer 118 is comprised of silicon nitride (Si3N4).

Contacts CT are formed within a first inter layer dielectric (ILD) layer 120. The contacts CT are conductive and comprised of a suitable material, such as tungsten, aluminum or copper. The contacts CT are located over the source/drain region 114 and the gate electrode 116. The first ILD layer 120 is formed over the contact etch stop layer 118 and is typically a low-κ dielectric. The first ILD layer 120 separates the contacts CT from one another.

The gate electrode 116 is in electrical communication with one of the metal lines 124 via one of inter layer dielectric (ILD) layer contacts CT. Similarly, the source/drain region 114 is in electrical communication with another of the metal lines 124 via a second of the ILD layer contacts CT. The metal lines 124 are formed within a second ILD layer 122, which is typically a low-κ dielectric. The second ILD layer 122 separates adjacent metal lines from one another. The second ILD layer 122 protects the device 100 from damage by support structures and the like and is also referred to as a back end of line (BEOL) layer.

The BDTI structure 128 is adjacent to doped region 110 and photodiode region 125 and provides isolation. The BDTI structure 128 includes a fill material. Typically, but not necessarily, the fill material is conductive, such as tungsten.

The BDTI structure 128 provides the isolation for the pixel sensor, including shielding, mitigated parasitic capacitance, mitigated leakage current. The BDTI structure 128 has a suitable depth to provide the isolation, such as, for example about 2.3 micro-meters. The sidewalls of the structure 128 are self-aligned with the sidewalls of the STI structure 108. Additionally, the BDTI structure 128 has a bottom surface flush or substantially co-planer with a bottom of the substrate 111 and/or diode region 110.

The provided isolation also mitigates interferences from adjacent pixel sensors. Such interference alters the light intensity recorded by the pixel sensor 100 and degrades generated digital versions of the image.

Figure 2:
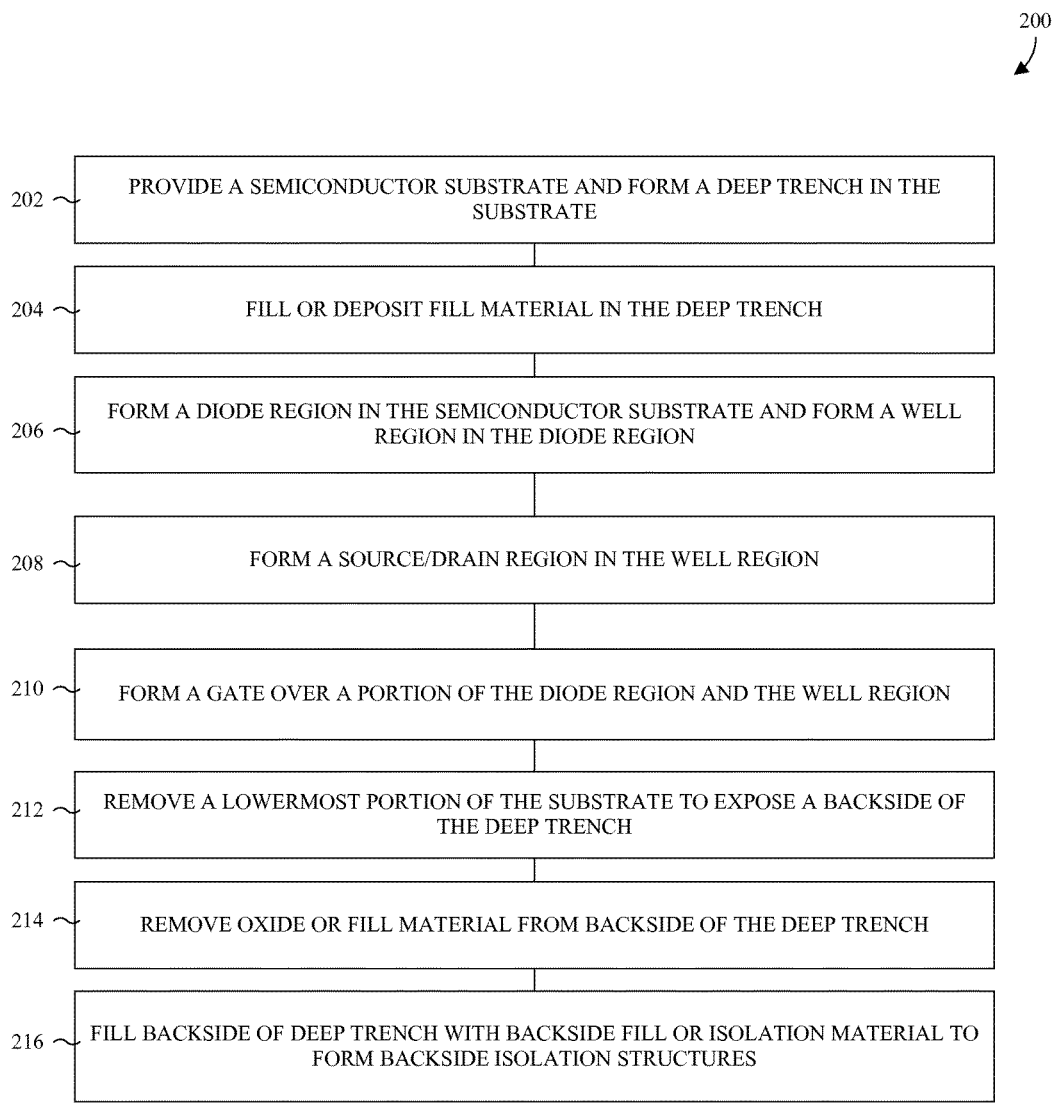
FIG. 2 is a flow diagram illustrating some embodiments of a method of forming a pixel sensor device having a self-aligned back side deep trench isolation (BDTI) structure.

FIG. 2 is a flow diagram illustrating a method 200 of forming a pixel sensor device having a self-aligned back side deep trench isolation (BDTI) structure.

A semiconductor substrate is provided at block 202 and a deep trench is formed in the substrate. The substrate is comprised of a semiconductor material, such as silicon. The deep trench is formed using a lithographic process to select portions of the substrate for etching. An etch process is performed to remove the selected portions to a selected depth to form the deep trench. Sidewalls of the trench are doped with a P type material, such as boron. Additionally, a liner oxide can be formed on sidewalls and a bottom of the deep trench. In one example, the deep trench is etched to a depth of about 2.3 micro meters, however other depths are contemplated.

The deep trench is filled with a fill material at block 204 to form a shallow trench isolation (STI) structure. The fill material can include one or more different types of material including silicon dioxide (oxide), polysilicon and the like. In one example, the deep trench is fully filled with oxide followed by a planarization process, such as chemical mechanical planarization resulting in the deep trench being filled with oxide. In another example, the deep trench is partially filled with oxide, etched back to remove excess oxide from non-trench areas, and followed by an epitaxial growth and followed by an additional oxide fill. In yet another example, the deep trench is partially filled with oxide and etched back. Polysilicon is then formed over the oxide fill. Then, additional oxide is formed over the polysilicon. A planarization process removes the excess oxide from above the deep trench.

A well region and a doped region are formed in the substrate at block 206. The doped region, also referred to as a photo diode or diode region is formed by doping the semiconductor substrate with an n-type material, such as phosphorous or arsenic. A suitable diffusion or ion implantation process can be used to form the doped region. The well region can be formed, in one example, by doping a selected portion of the diode region with an opposite dopant type, which in this example is a p-type material, such as boron. The well region is typically shallower than the doped/diode region.

A source/drain region, also referred to as a floating node (FD), is formed within the well region at block 208. The drain region is formed by applying a suitable dopant to form a shallow drain region within the doped region. In one example, multiply implants of an n-type material are performed.

A gate is formed over a portion of the source/drain region and the well region at block 210. In one example, the gate is formed with polysilicon and sidewalls. A gate dielectric layer is formed between the gate and the source/drain region and the well region. A silicon nitride layer is formed over the device. An interlayer dielectric layer is formed over the silicon nitride layer. Interlayer contacts to the source/drain region and the gate are formed within the interlayer dielectric layer. A back end of line layer (BEOL) is formed over the interlayer dielectric layer. Metal pads are formed in contact with the interlayer contacts.

Backside processing of the device begins with removing a lowermost portion of the substrate to expose a backside surface of 104 by polishing or grinding a backside at block 212. The semiconductor device is typically physically rotated to facilitate the backside processing. The BEOL layer protects the part of 104 is exposed semiconductor device while being supported by a chuck or other component. The semiconductor substrate is removed by polishing or grinding a backside to substantially remove the remaining semiconductor substrate.

Backside trench structures are formed at block 214 by removing oxide from exposed oxide regions of the deep trench. In one example, the backside is subjected to a planarization process to expose oxide regions. A suitable process, such as a hydro-fluoric acid dip is used to remove oxide from the exposed oxide in the deep trench.

The backside trenches are filled with a backside fill material at block 216 to form backside isolation structures or regions. Suitable fill materials can be used to confine incident light in the doped or diode region. In one example, the exposed backside of the deep trench is filled with a conductive material, such as tungsten, aluminum, and the like. The conductive material additionally permits electrical communication with layers including the well region and the doped region and permits biasing to be applied. Additionally, the conductive material can facilitate shielding and the like.

In another example, the exposed backside of the deep trench is filled with an insulative material, such as oxide and the like. In this example, the insulative material additionally mitigates leakage current between adjacent devices and the like.

The backside isolation structures are formed on the backside of the deep trench, whereas the shallow trench isolation structures are formed on the front side of the deep trench. As a result, the backside isolation structures are self-aligned with the shallow trench isolation structures. Additionally, the backside isolation structures are generally coplanar with a bottom surface of the substrate or well and doped regions.

While the disclosed method (e.g., the method described by FIG. 2) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-11, cross sectional views of some embodiments of a semiconductor device at various stages of manufacture are provided to illustrate the method of FIG. 2. Although FIGS. 3-11 are described in relation to the method, it is appreciated that the structures disclosed in FIGS. 3-11 are not limited to the method, but may stand alone as structures independent of the method. Similarly, although the method is described in relation to FIGS. 3-11, it is appreciated that the method is not limited to the structures shown in FIGS. 3-11, but may stand alone independent of the structures disclosed in FIGS. 3-11.

Figure 3:
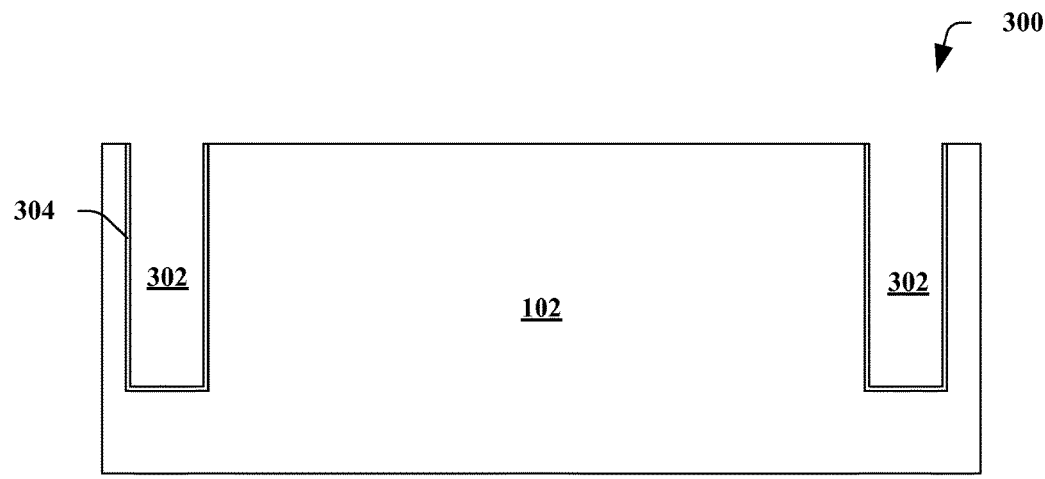
FIGS. 3-11 illustrate a series of cross-sectional views of some embodiments of a semiconductor device at various stages of manufacture, the semiconductor device including a backside deep trench isolation structure.

FIG. 3 is a cross sectional view 300 illustrating some embodiments corresponding to block 202. As illustrated, a semiconductor substrate 102 is provided. The substrate 102 is comprised of a suitable semiconductor material, such as silicon. A deep trench 302 is formed in the substrate 102 by selectively removing portions of the substrate 102. A liner oxide 304 can optionally be conformally formed along sidewalls and bottom of the deep trench 302. A thermal oxidation process or other suitable process can be used to form the liner oxide.

Figure 4:
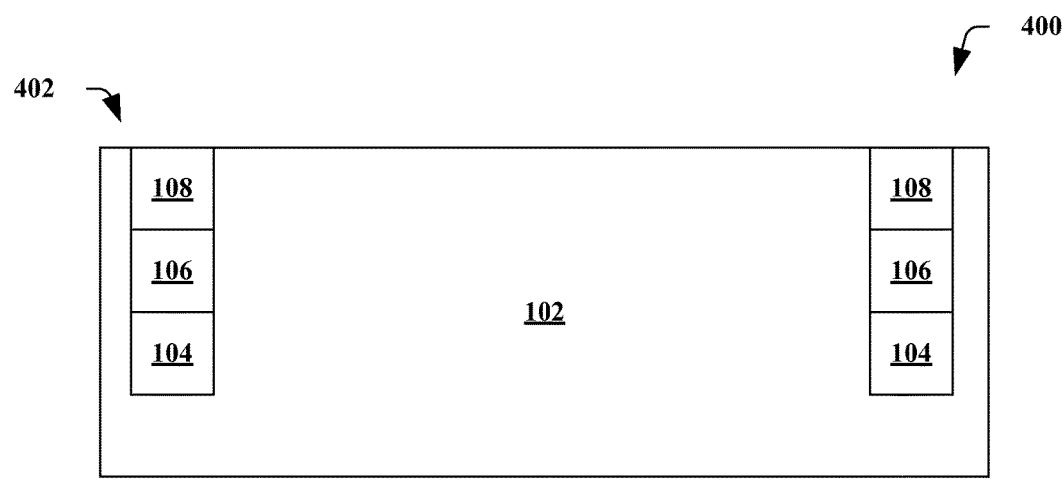

FIG. 4 is a cross sectional view 400 illustrating some embodiments corresponding to block 204. The optional liner oxide 304 FIG. 3 is not shown in this illustrated embodiment, but it will be appreciated that it can be included in alternative embodiments. As illustrated, the deep trench 302 is filled with fill material 402. The fill material 402 can include one or more types of material including, but not limited to, silicon dioxide, polysilicon and the like.

In one example, a first oxide 104 is formed in the deep trench. In one example, a flowable oxide deposition is used to fill the deep trench 302 with oxide. A wet or dry etch removes the oxide, in one example to below the top surface of the substrate 102 by about 1 to 2 micro meters to form the first oxide 104. A polysilicon layer 106 is formed in the trench over the first oxide 104. In one example, a polysilicon deposition completely fills the deep trench 302. Then, a poly etch back is performed, in one example to about 1000 Angstroms below the top surface of the substrate 102. A second oxide layer 108 is formed over the polysilicon layer 106 by forming additional oxide over the trench. The second oxide layer 108 also serves as a shallow trench isolation (STI) structure. A planarization process, such as chemical mechanical planarization, removes excess oxide from the device.

In another example, the fill material 402 is formed by forming an oxide layer in the deep trench to completely fill the trench. A flowable oxide deposition, for example, completely fills the deep trench with oxide and also covers portions of the substrate 102. As a result, layers 104, 106 and 108 are comprised of oxide. A planarization process is performed to remove excess oxide from the device.

In yet another example, the fill material 402 is formed by depositing oxide in the deep trench to partially fill the deep trench 302. A wet or dry etch back is performed to remove a small portion of the formed oxide and an epitaxial layer is formed above the oxide layer using an epitaxial growth process to fill the deep trench. In one example, the epitaxial layer is boron-doped p-type silicon epitaxial, which provides boron to sidewalls of the second oxide layer 108. An etch back or CMP process is performed to remove excess of the epitaxial layer. The second oxide layer 108 can be formed over the epitaxial layer 106. Alternately, the epitaxial layer 106 can extend to an upper surface of the deep trench 302.

It is appreciated that suitable variations in the filling of the deep trench are contemplated.

Figure 5:
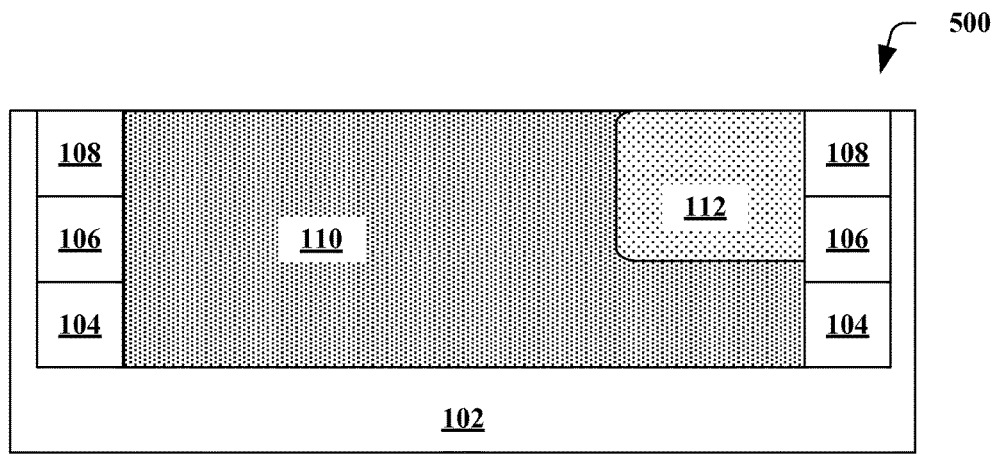

FIG. 5 is a cross sectional view 500 illustrating some embodiments corresponding to block 206. A doped region 112, also referred to as a diode region or photodiode is formed within the substrate 102 by doping the substrate 102 with an n-type dopant, such as phosphorous or arsenic. In one example, a lithography process is used to form a mask over the substrate, and after the mask has been formed, phosphorous is selectively implanted into the substrate through openings in the mask to form the doped region 110. A well region 112 is formed within the doped/diode region 110 by selectively doping the diode region 110 with a p-type dopant, such as boron. In one example, a lithography process is used to selectively implant boron to form the well region 112. Although FIG. 5 shows peripheral regions of the substrate outside of the trenches as not being subject to implant, it will be appreciated that in other embodiments that these peripheral regions can also be implanted with ions to establish an array of pixel sensors.

Figure 6:
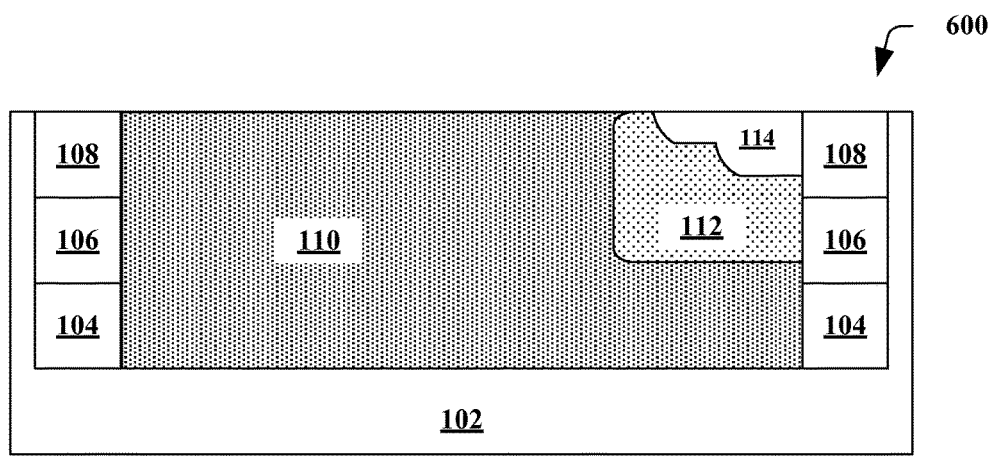

FIG. 6 is a cross sectional view 600 illustrating some embodiments corresponding to block 208. A source/drain region 114 is formed in the well region 112 by selectively doping with an n-type dopant. In one example, the source/drain region 114 is formed by multiple implants with phosphorous using lithography. The source/drain region 114 and the doped region 110 operate as a photodiode.

Figure 7:
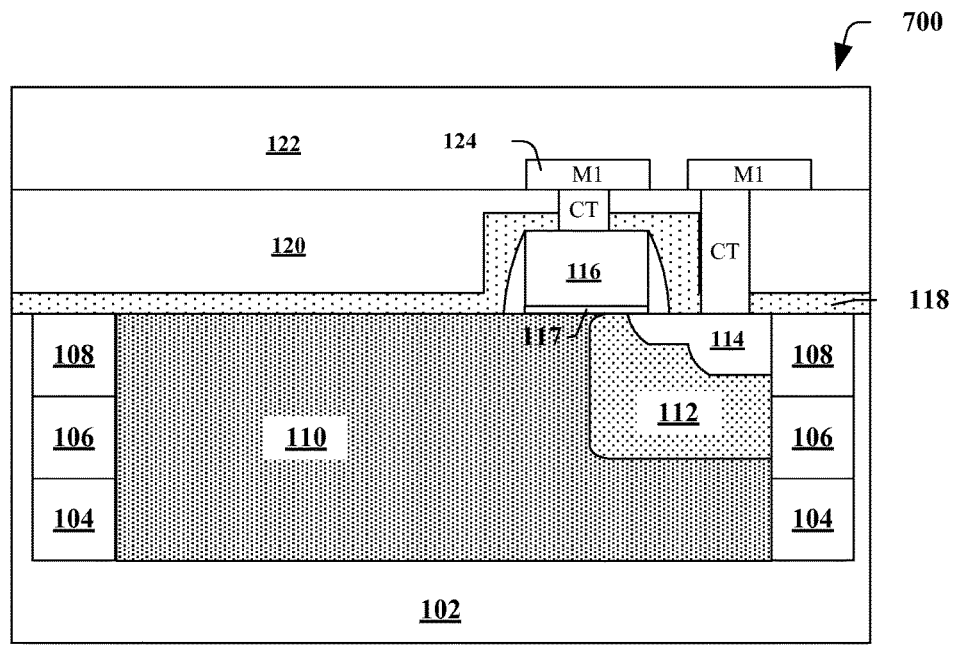

FIG. 7 is another cross sectional view 700 illustrating some embodiments corresponding to block 210 of the method 200. Front side fabrication of the semiconductor device is substantially completed. A gate 116 is selectively formed over a portion of the source/drain region 114, the doped region 110 and a portion of the well region 112. The gate 116, in one example, is comprised of polysilicon and includes two sidewall portions. The gate 116 is formed, in one example, by depositing polysilicon and patterning the depositing polysilicon to remove selected portions leaving the gate 116. A gate dielectric 117 is between the gate 116 and other regions including the well region 112, the doped region 110 and the source/drain region 114. The gate 116 can operate as a transfer gate.

A contact etch stop layer 118 is formed over the semiconductor device including the gate 116, well region 112 and the doped region 110. The contact etch stop layer 118, in one example, is comprised of silicon nitride. A first interlayer dielectric (ILD) layer 120 is formed over the contact etch stop layer 118. The first ILD layer 120 is comprised of a suitable material, typically a low k dielectric type material. Contacts shown as CT are formed in the ILD layer 120 and through the contact etch stop layer 118 to provide electrical communication to the gate 116 and the source/drain region 114. The first ILD layer 120 separates the contacts CT from one another.

Metal lines 124 are formed over the ILD contacts CT within a second ILD layer 122. The second ILD layer 122 is formed over the first ILD layer 120. The second ILD layer 122 separates the metal lines 124 from one another and can protect and encapsulate the contacts 124 and lower layers. The second ILD layer 122 is also referred to as a back end of line (BEOL) layer.

Figure 8:
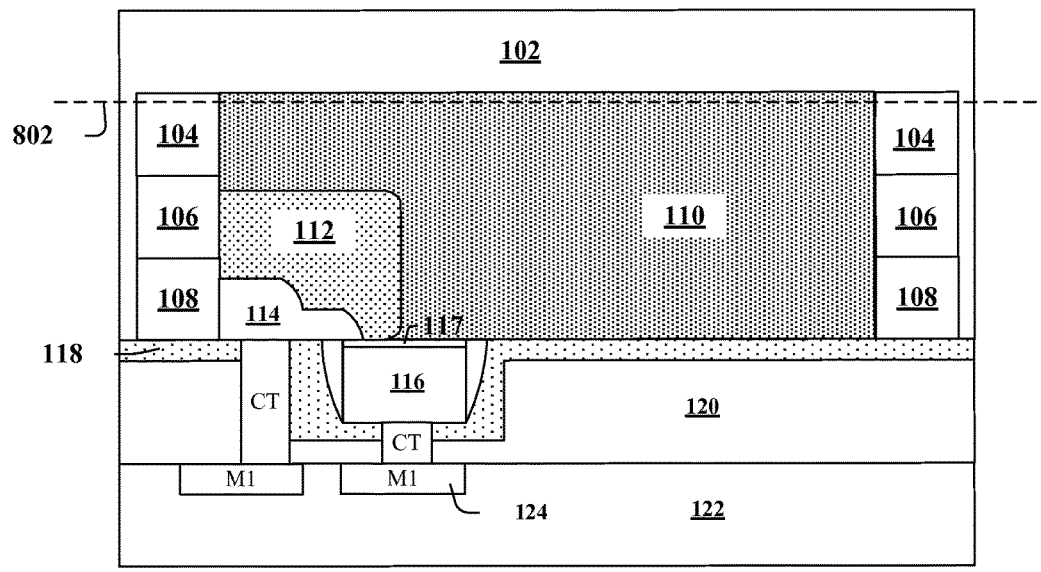

FIG. 8 is a cross sectional view 800 illustrating some embodiments corresponding to block 212. The semiconductor device is rotated as shown so that the substrate 102 is at the top. The second ILD layer 122 can rest on a support, such as a chuck or other component. The second ILD layer 122 provides protection from the support or other component.

A grinding or polishing process 802 is initiated on the backside to remove portions of the substrate 102. The grinding process is selectively controlled to thin the device without damaging the device, including the well region 112 and the doped region 110.

Figure 9:
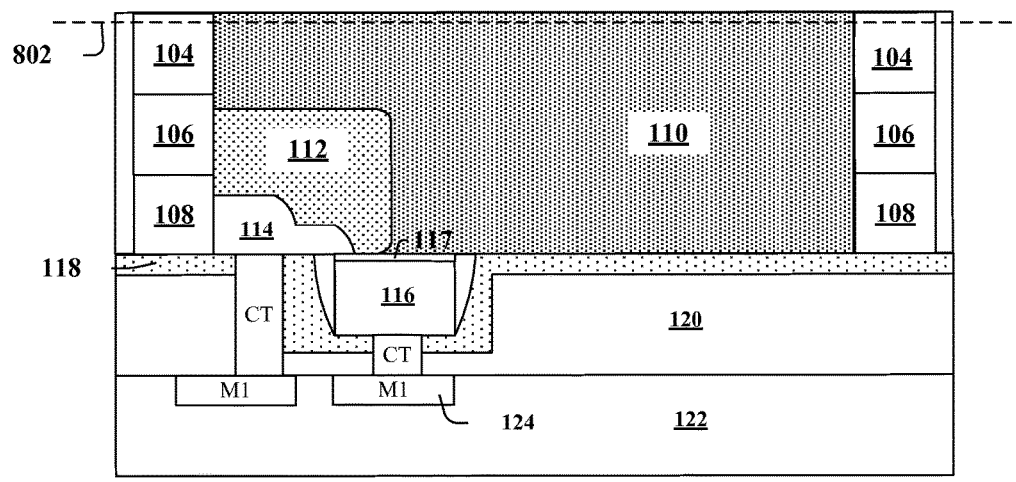

FIG. 9 is a cross sectional view 900 illustrating some embodiments after the grinding or polishing of block 212 has been carried out. As shown in FIG. 9, the grinding process 802 has removed portions of the substrate 102 from the device. The grinding process 802 is controlled by time or other suitable mechanism to remove the substrate 102 without removing significant portions of the doped region 110 and the well region 112. Additionally, the grinding process 802 may expose the first oxide 104 by removing the substrate 102 from over it.

Figure 10:
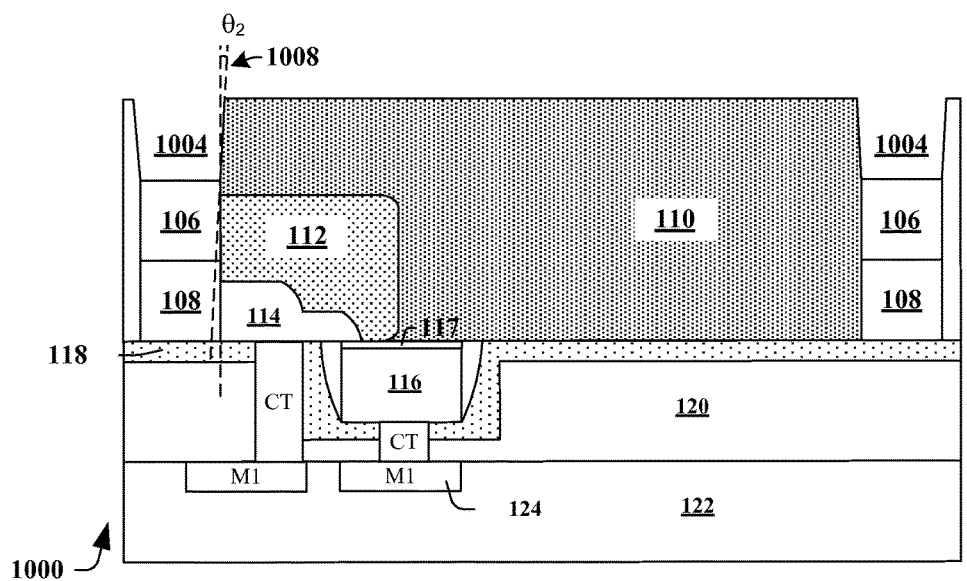

FIG. 10 is a cross sectional view 1000 illustrating some embodiments corresponding to block 214. A planarization process is used to expose or more fully expose the first oxide 104 of the deep trench. There may still be remnants from the substrate 102 present over or on the first oxide 104. Backside trenches 1004, or backside portions of the deep trench, are formed by removing the exposed first oxide 104, without substantially removing the polysilicon layer 106.

The exposed oxide regions 104 are removed using a suitable oxide removal process. In one example, the exposed oxide regions 104 are removed using a hydro-fluoric acid dip.

The backside trenches 104 can have an angle or tapered sidewall 1008 as a result of the removal of the exposed first oxide. The angle, shown as $\theta_2$ can vary from zero to another suitable angle.

Figure 11:
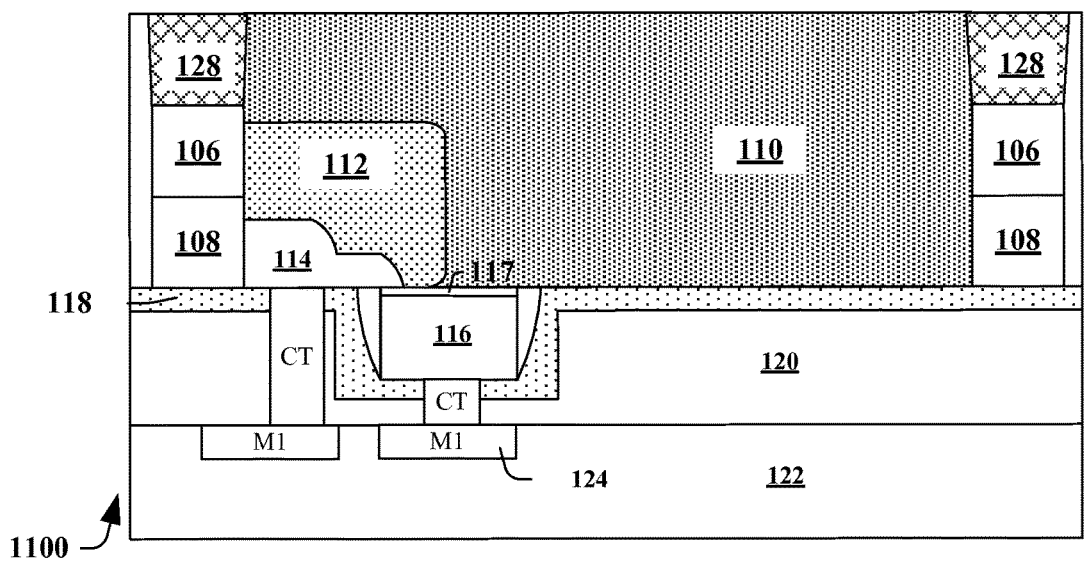

FIG. 11 is a cross sectional view 1100 illustrating some embodiments corresponding to block 216 of the method 200. The backside of the deep trench 1004 is filled with a backside fill or isolation material to form a backside isolation structure 128 or region.

The backside fill material can be insulating or conductive. In one example, the backside isolation material is tungsten, in another the backside isolation material is silicon nitride. The backside trenches 1004 are filled using a suitable fill process for the backside fill/isolation material. In one example, the fill process uses a high-k dielectric (HK) deposition. The HK deposition deposits a material having a dielectric constant greater than that of SiO2. In one example, the backside fill material is deposited over the device to a suitable depth, such as about 200 to 500 Angstroms, and fills the backside trenches 1004. A planarization or etch back process is then used to have remaining backside fill material only the backside trench 1004, thereby forming the backside isolation structures 128. Other examples of the backside fill material include tungsten, aluminum, oxide and the like. The backside fill material facilitates confining incident light in the doped or diode region 110.

In another example, a thinner oxide, such as 20 to 50 Angstroms, is formed over the device including sidewalls and bottom of the backside of the backside trench 1004. A high-k liner, such as 200-500 Angstroms, is formed over the thinner oxide. Then the backside fill material is formed or deposited to completely fill the backside trenches 1004. Subsequently, a chemical mechanical planarization or etch back can be used to remove the backside fill material from non trench regions.

The backside isolation regions 128, alone or in combination with the polysilicon region 106 and the first oxide 108 are configured to be backside deep trench isolation (BDTI)

structures or regions. The backside isolation structure 128 is self-aligned with the front side shallow trench isolation structure, such as the first oxide 108 due to the formation process.

As can be appreciated from above, the present disclosure provides a pixel sensor device. The device includes a shallow trench isolation structure, a diode region, a well region and a backside isolation structure. The diode region is at least partially adjacent to the shallow trench isolation structure. The well region is within the diode region and adjacent to the shallow trench isolation structure. The backside isolation structure is self-aligned with and arranged over the shallow trench isolation structure. The backside isolation structure is self-aligned with and arranged over the shallow trench isolation structure and is adjacent to the diode region.

In one example, the backside isolation structure includes a backside fill material. In one example the backside fill material is conductive. In another example, the backside fill material is insulative.

A method for manufacturing a pixel sensor device is disclosed. A deep trench is formed in a substrate. The deep trench is filled with a fill material forming a shallow trench isolation structure. A diode region is formed in the substrate. At least a portion of the substrate is removed from a backside of the device. A backside of the deep trench is exposed. A portion of the fill material from the deep trench is removed. The backside of the deep trench is filled with a backside fill material.

In one example, the backside fill material is tungsten and forms a BDTI structure.

In another example of the method, a well region is formed within the diode region.

In another example of the method, a source/drain region is formed within the well region.

The present disclosure provides another pixel sensor device. The device includes a shallow trench isolation structure, a polysilicon region, a well region, a source/drain region and a backside isolation structure. The polysilicon region is positioned above the shallow trench isolation structure. The well region is adjacent to the shallow trench isolation structure. The source/drain region is adjacent to the shallow trench isolation structure. The backside isolation structure is self-aligned with the shallow trench isolation structure. Additionally, the backside isolation structure is over the shallow trench isolation structure and is adjacent to the well region and a bottom of the backside isolation structure is coplanar with a backside of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a pixel sensor device, the method comprising:
   forming a deep trench in a substrate;
   filling the deep trench with a dielectric fill material to form a sacrificial structure in a lower region of the deep trench and a shallow trench isolation structure in an upper region of the deep trench;
   forming a diode region in the substrate, the diode region being surrounded by the shallow trench isolation structure;
   removing at least a portion of the substrate from a backside of the device to expose a backside of the sacrificial structure;
   removing a portion of the dielectric fill material corresponding to the sacrificial structure from the exposed backside of the deep trench to form a recess; and
   filling the recess with a backside fill material.

2. The method of claim 1, wherein filling the recess includes filling the recess with tungsten to form a backside deep trench isolation (BDTI) structure.

3. The method of claim 1, further comprising forming a well region within the diode region.

4. The method of claim 3, further comprising forming a source/drain region within the well region.

5. The method of claim 4, further comprising forming a gate over at least a portion of the well region.

6. The method of claim 4, further comprising forming a contact etch stop layer over the source/drain region and the deep trench.

7. The method of claim 6, further comprising forming an interlayer dielectric (ILD) layer over the contact etch stop layer and prior to removing the at least the portion of the substrate from the backside of the device.

8. The method of claim 1, wherein removing the portion of the dielectric fill material from the deep trench includes using a hydro fluoric acid dip to remove exposed oxide from the backside of the deep trench.

9. A method, comprising:
   receiving a semiconductor substrate, the semiconductor substrate having a substrate thickness as measured between a frontside of the substrate and a backside of the substrate;
   removing a portion of the semiconductor substrate to form a trench in the frontside of the substrate, the trench extending to a trench depth, as measured from the frontside of the substrate, the trench depth being less than the substrate thickness;
   filling the trench with a first fill material to form a trench isolation structure including a sacrificial structure at a bottom region of the trench;
   after the trench has been filled with the first fill material, planarizing or grinding the backside of the substrate to remove a region of the substrate and expose a lowermost region of the first fill material corresponding to the sacrificial structure in the trench;
   selectively removing the exposed lowermost region of the first fill material and the sacrificial structure from the trench to form a recess, the recess being self-aligned with an upper region of the trench isolation structure that remains in the trench; and
   filling the recess with a second fill material.

10. The method of claim 9, wherein the exposed lowermost region of the first fill material has a different etch rate for a predetermined etch than the upper region of the trench isolation structure that remains in the trench, and wherein selectively removing the exposed lowermost region of the first fill material is achieved by carrying out the predetermined etch.

11. The method of claim 9, wherein selectively removing the exposed lowermost region of the first fill material widens a lowermost region of the trench so the lowermost region of the trench has sidewalls which are separated by a first distance, and the first distance is greater than a second distance separating sidewalls of an upper region of the trench.

12. The method of claim 9, wherein filling the trench with the first fill material comprises:
   filling a lowermost region of the trench with a first dielectric material, which corresponds to the sacrificial structure;
   filling an intermediate region of the trench, which resides over the lowermost region of the trench, with a conductive material; and
   filling an uppermost region of the trench, which resides over the intermediate region of the trench, with a second dielectric material.

13. The method of claim 12, wherein selectively removing the exposed lowermost region of the first fill material comprises selectively removing the first dielectric material from the lowermost region of the trench while leaving the conductive material in the intermediate region of the trench and while leaving the second dielectric material in the uppermost region of the trench.

14. The method of claim 12, wherein the second fill material is different from each of the first dielectric material, the second dielectric material, and the conductive material.

15. The method of claim 12, wherein the first dielectric material and the second dielectric material are silicon dioxide and the conductive material is polysilicon.

16. The method of claim 15, wherein the second fill material is tungsten.

17. A method, comprising:
   receiving a substrate having a frontside and a backside;
   forming a trench extending into the frontside of the substrate;
   forming a sacrificial fill material in a lowermost region of trench;
   forming a first fill material in the trench over the sacrificial fill material;
   forming a photodetector in the substrate, the photodetector being laterally surrounded by the first fill material;
   after the trench has been filled with the first fill material, planarizing or grinding the backside of the substrate to remove a region of the substrate and expose the sacrificial fill material in the lowermost region of the trench;
   selectively removing the sacrificial fill material from the trench, thereby forming a recess in the backside of the substrate while leaving the first fill material in the trench; and
   filling the recess with a second fill material.

18. The method of claim 17, wherein the first fill material is polysilicon or oxide, and the second fill material is tungsten.

19. The method of claim 17, wherein the first fill material has the same composition as the sacrificial fill material and has a different composition than the second fill material.

20. The method of claim 17, wherein the first fill material has a different composition from the sacrificial fill material, and the second fill material has a different composition from each of the first fill material and the sacrificial fill material.

* * * * *